(12) United States Patent
Haraguchi et al.

(10) Patent No.: US 10,978,413 B2
(45) Date of Patent: Apr. 13, 2021

(54) CIRCUIT SYSTEM HAVING COMPACT DECOUPLING STRUCTURE

(71) Applicant: AP Memory Technology Corp., Hsinchu County (TW)

(72) Inventors: Masaru Haraguchi, Hsinchu County (TW); Yoshitaka Fujiishi, Hsinchu County (TW)

(73) Assignee: AP MEMORY TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 16/701,792

(22) Filed: Dec. 3, 2019

(65) Prior Publication Data

US 2020/0105688 A1  Apr. 2, 2020

Related U.S. Application Data

(62) Division of application No. 15/851,461, filed on Dec. 21, 2017, now abandoned.

(51) Int. Cl.
*H05K 1/18* (2006.01)
*H01L 23/66* (2006.01)
(Continued)

(52) U.S. Cl.
CPC ........ *H01L 23/66* (2013.01); *H01L 23/49816* (2013.01); *H01L 23/5389* (2013.01); *H01L 23/642* (2013.01); *H01L 24/16* (2013.01); *H01L 25/16* (2013.01); *H01L 25/162* (2013.01); *H01L 28/40* (2013.01); *H05K 1/111* (2013.01); *H05K 1/181* (2013.01); *H01L 2223/6666* (2013.01); *H01L 2224/1357* (2013.01); *H01L 2224/13082* (2013.01); *H01L 2224/13147* (2013.01); *H01L 2224/16145* (2013.01);
(Continued)

(58) Field of Classification Search
CPC ... H05K 1/11; H05K 1/14; H05K 1/18; H05K 2201/1063; H01L 23/00; H01L 23/64; H01L 23/86; H01L 23/492; H01L 23/538
USPC .......................... 361/770–790; 174/259–264; 257/685–730
See application file for complete search history.

(56) References Cited

U.S. PATENT DOCUMENTS 7,005,747 B2 * 2/2006 Koizumi ............... H01L 21/563
257/777
8,339,797 B2 * 12/2012 Maeda .............. H01L 23/49816
361/764

(Continued)

*Primary Examiner* — Tuan T Dinh
(74) *Attorney, Agent, or Firm* — Sinorica, LLC

(57) ABSTRACT

A circuit system having compact decoupling structure, including: a mother board; at least one circuit unit, each having a substrate, a logic-circuit die, a plurality of first metal contacts, and a plurality of second metal contacts, the substrate having a first surface and a second surface, the first metal contacts being formed on the first surface and soldered onto the mother board, the second metal contacts being formed on the logic-circuit die and soldered onto the second surface to form flip-chip pillars, and the flip-chip pillars determining a height of a gap between the die and the substrate; and at least one decoupling unit for providing an AC signals decoupling function for the at least one circuit unit; wherein each of the at least one decoupling unit is placed in the gap of one said circuit unit and includes a mother die and at least one stack-type integrated-passive-device die.

6 Claims, 4 Drawing Sheets

(51) Int. Cl.
*H01L 49/02* (2006.01)
*H01L 23/498* (2006.01)
*H01L 25/16* (2006.01)
*H05K 1/11* (2006.01)
*H01L 23/538* (2006.01)
*H01L 23/00* (2006.01)
*H01L 23/64* (2006.01)

(52) U.S. Cl.
CPC ............... *H01L 2224/16227* (2013.01); *H01L 2224/16265* (2013.01); *H01L 2924/014* (2013.01); *H01L 2924/1431* (2013.01); *H01L 2924/15311* (2013.01); *H01L 2924/19011* (2013.01); *H01L 2924/19041* (2013.01); *H01L 2924/19104* (2013.01); *H01L 2924/19105* (2013.01); *H01L 2924/19106* (2013.01); *H05K 2201/10734* (2013.01)

(56) References Cited

U.S. PATENT DOCUMENTS

| 8,379,400 | B2* | 2/2013 | Sunohara | H01L 23/49827 |
| | | | | 361/760 |
| 8,466,543 | B2* | 6/2013 | Fleischman | H01L 25/18 |
| | | | | 257/686 |
| 9,379,078 | B2* | 6/2016 | Yu | H01L 24/13 |
| 2002/0079568 | A1* | 6/2002 | Degani | H01L 25/105 |
| | | | | 257/686 |
| 2004/0145054 | A1* | 7/2004 | Bang | H01L 25/105 |
| | | | | 257/737 |
| 2012/0155047 | A1* | 6/2012 | Kim | H01L 23/49816 |
| | | | | 361/783 |
| 2012/0211885 | A1* | 8/2012 | Choi | H01L 21/563 |
| | | | | 257/737 |
| 2015/0069637 | A1* | 3/2015 | Zhao | H01L 24/29 |
| | | | | 257/778 |
| 2017/0047261 | A1* | 2/2017 | Lu | H01L 25/105 |

* cited by examiner

CIRCUIT SYSTEM HAVING COMPACT DECOUPLING STRUCTURE

FIELD OF THE INVENTION

The present invention relates to an AC (alternating current) signals decoupling structure, especially to a circuit system having a compact AC signals decoupling structure.

BACKGROUND OF THE INVENTION

To protect a powered circuit system from being interfered by switching noises or AC signals from a power supply circuit, a decoupling means is usually adopted in practical circuit designs.

Please refer to FIG. 1, which illustrates a cross-sectional view of a circuit system having a decoupling structure of prior art. As illustrated in FIG. 1, the circuit system includes a mother board 10, a circuit unit 11, and a decoupling capacitor 12.

The mother board 10 is used for carrying the circuit unit 11 and the decoupling capacitor 12.

The circuit unit 11 has a substrate 11a, a die 11b, and a plurality of metal contacts 11c, the die 11b being formed on the top surface of the substrate 11a, the metal contacts 11c being formed on the bottom surface of the substrate 11a and soldered onto the mother board 10.

The decoupling capacitor 12 is placed on the top surface of the substrate 11a and beside the die 11b for providing an AC signals decoupling function.

For another decoupling structure, please refer to FIG. 2, which illustrates a cross-sectional view of another circuit system having a decoupling structure of prior art. As illustrated in FIG. 2, the circuit system includes a mother board 10, a circuit unit 11, and a decoupling capacitor 12.

The mother board 10 is used for carrying the circuit unit 11 and the decoupling capacitor 12.

The circuit unit 11 has a substrate 11a, a die 11b, and a plurality of metal contacts 11c, the die 11b being formed on the top surface of the substrate 11a, the metal contacts 11c being formed on the bottom surface of the substrate 11a and soldered onto the mother board 10.

The decoupling capacitor 12 is placed on the mother board 10 and beside the circuit unit 11 for providing an AC signals decoupling function.

To minimize the form factor of a circuit system, the metal contacts 11c can be BGA (ball grid array) contacts. However, as the decoupling capacitor 12 is required to possess large capacitance to provide the AC signals decoupling function, the size of the decoupling capacitor 12 will be quite large to compromise the form factor of both the circuit systems of FIG. 1 and FIG. 2. Besides, as there is a length of conductive trace connecting the decoupling capacitor 12 and the die 11b, there will be substantial parasite resistance and parasite inductance to compromise the AC signals decoupling effect. For example, an LC resonant frequency can be introduced into the circuit unit 11 due to the combination of the parasite inductance and the decoupling capacitor 12.

To solve the foregoing problems, a novel decoupling structure for a circuit system is needed.

SUMMARY OF THE INVENTION

One objective of the present invention is to disclose a circuit system having compact decoupling structure to provide a low profile form factor.

Another objective of the present invention is to disclose a circuit system having compact decoupling structure to provide low parasite resistance and low parasite inductance to optimize the AC signals decoupling function.

To attain the foregoing objectives, a circuit system having compact decoupling structure is proposed, including:

a mother board;

at least one circuit unit, each having a substrate, a logic-circuit die, a plurality of first metal contacts, and a plurality of second metal contacts, wherein the substrate has a first surface and a second surface opposing the first surface, the first metal contacts are formed on the first surface and soldered onto the mother board, the second metal contacts are formed on the logic-circuit die and soldered onto the second surface of the substrate to form flip-chip pillars, and the flip-chip pillars determine a height of a gap between the logic-circuit die and the substrate; and at least one decoupling unit for providing an AC signals decoupling function for the at least one circuit unit;

wherein, each of the at least one decoupling unit is placed in the gap of one said circuit unit and includes a mother die, at least one stack-type integrated-passive-device die, and a plurality of third metal contacts, the third metal contacts being formed on the mother die and soldered onto the logic-circuit die, and the at least one stack-type integrated-passive-device die each having a plurality of fourth metal contacts formed thereon and soldered onto the mother die.

In one embodiment, the second metal contacts are controlled-collapse-chip-connection bumps.

In one embodiment, the third metal contacts are controlled-collapse-chip-connection bumps.

In one embodiment, the fourth metal contacts are Cu-pillar-with-solder-cap bumps.

In one embodiment, the at least one stack-type integrated-passive-device die includes at least one decoupling capacitor.

In one embodiment, the decoupling capacitor is a stack-type capacitor.

In one embodiment, the first metal contacts are BGA contacts.

To attain the foregoing objectives, another circuit system having compact decoupling structure is proposed, including:

a mother board;

at least one circuit unit, each having a substrate, at least one die, and a plurality of metal contacts, the substrate having a first surface and a second surface opposing the first surface, the at least one die being formed on the first surface, the metal contacts being formed on the second surface and soldered onto the mother board, and a gap being formed between the substrate and the mother board and having a height less than 50 micrometers; and at least one decoupling unit, being placed in the gap and soldered onto the substrate for providing a decoupling function for the at least one circuit unit.

In one embodiment, the decoupling unit includes a discrete capacitor having a height less than 30 micrometers.

In one embodiment, the discrete capacitor is a stack-type capacitor.

In one embodiment, the metal contacts are BGA (ball grid array) contacts.

To attain the foregoing objectives, still another circuit system having compact decoupling structure is proposed, including:

a mother board;

at least one circuit unit, each having a substrate, at least one first die, at least one second die, and a plurality of metal contacts, the substrate having a first surface and a second surface opposing the first surface, a gap being formed between the substrate and the mother board and having a height less than 50 micrometers, the at least one first die being formed on the first surface, the at least one second die being embedded in an inner region of the substrate, the inner region having a height less than 50 micrometers, and the metal contacts being formed on the second surface and soldered onto the mother board; and at least one decoupling unit, being placed in the inner region and connected electrically with the at least one second die in close proximity, or placed in the gap and soldered onto the substrate for providing an AC signals decoupling function for the at least one circuit unit.

In one embodiment, the decoupling unit includes a discrete capacitor having a height less than 30 micrometers.

In one embodiment, the discrete capacitor is a stack-type capacitor.

In one embodiment, the metal contacts are BGA (ball grid array) contacts.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
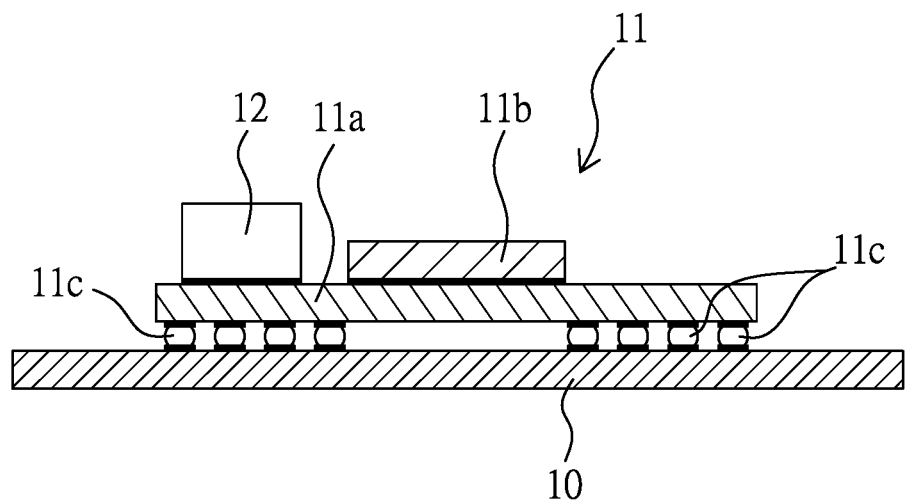
FIG. 1 illustrates a cross-sectional view of a circuit system having a decoupling structure of prior art.
Figure 2:
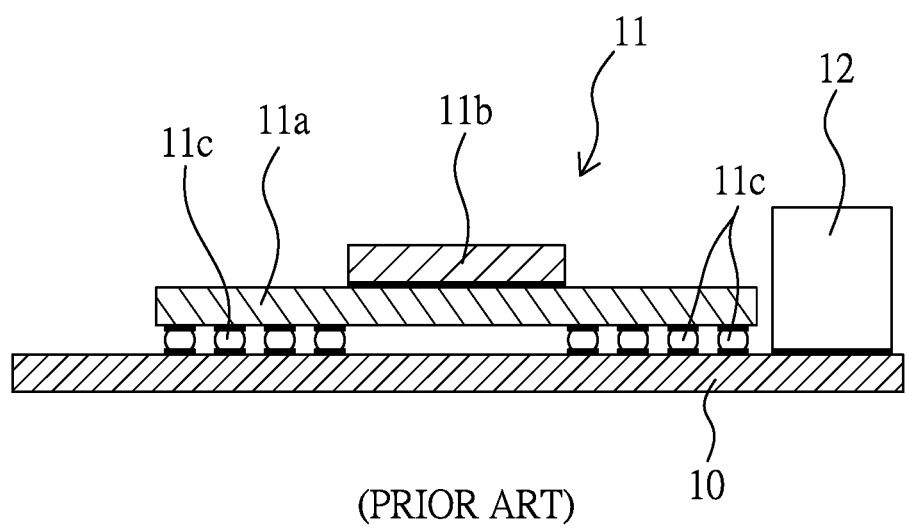
FIG. 2 illustrates a cross-sectional view of another circuit system having a decoupling structure of prior art.
Figure 3:
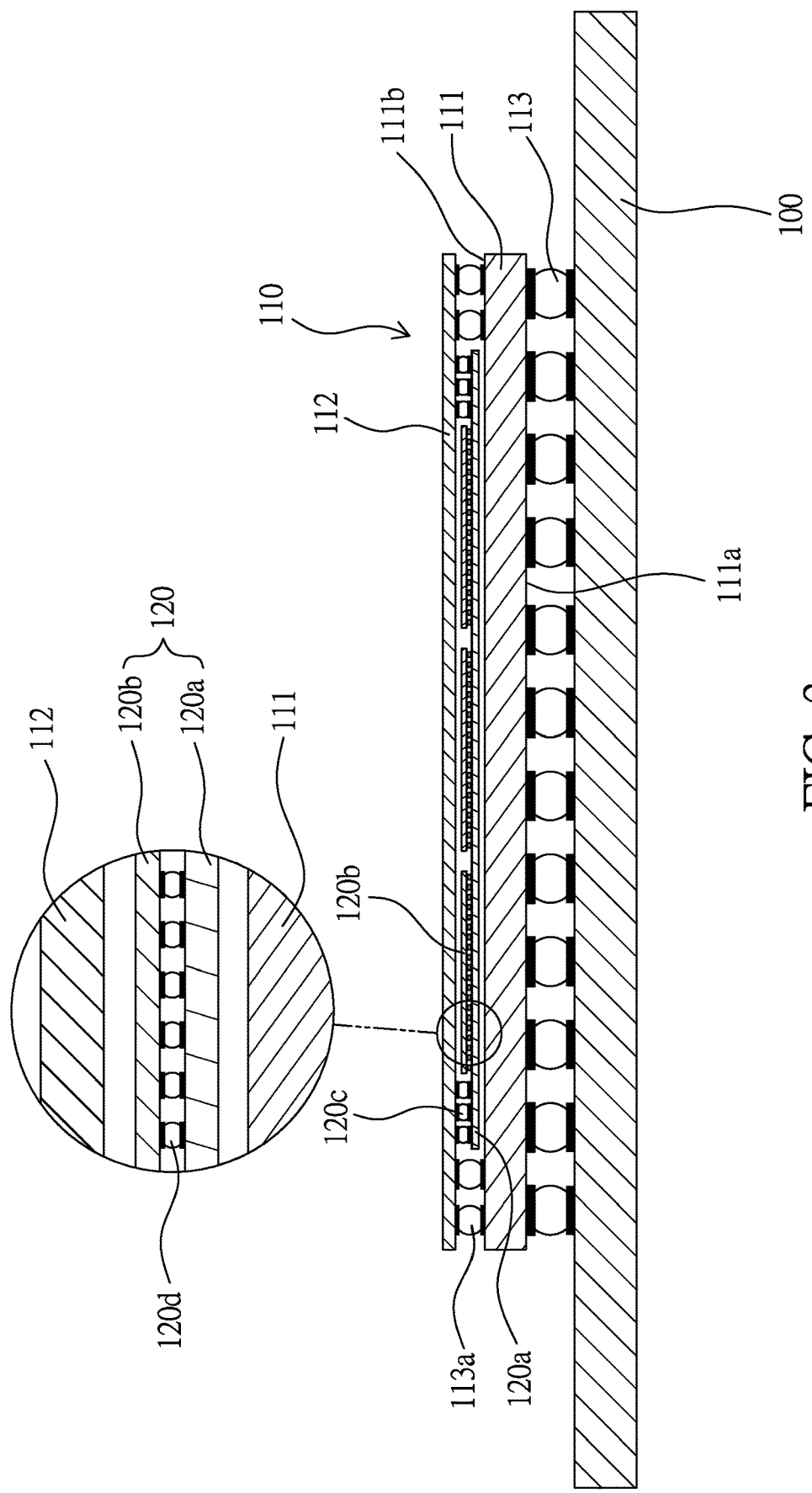
FIG. 3 illustrates a cross-sectional view of a circuit system having compact decoupling structure according to one embodiment of the present invention.

Please refer to FIG. 3, which illustrates a cross-sectional view of a circuit system having compact decoupling structure according to one embodiment of the present invention. As illustrated in FIG. 3, the circuit system having compact decoupling structure includes a mother board 100, at least one circuit unit 110, and at least one decoupling unit 120.

The mother board 100 is used for carrying the at least one circuit unit 110 and the at least one decoupling unit 120.

Each circuit unit 110 has a substrate 111, at least one die 112, and a plurality of first metal contacts 113.

The substrate 111 has a first surface 111a and a second surface 111b opposing the first surface 111a.

The at least one die 112, which can be a logic-circuit die, has a plurality of second metal contacts 113a. The second metal contacts 113a can be C4 (controlled-collapse-chip-connection) bumps formed on the die 112 and soldered onto the second surface 111b to form flip-chip pillars, and thereby determine the height of a gap between the die 112 and the substrate 111, the gap being used for accommodating the decoupling unit 120.

The first metal contacts 113, which can be BGA (ball grid array) contacts, are formed on the first surface 111a and soldered onto the mother board 100.

The decoupling unit 120 is placed in the gap and soldered onto the die 112 for providing an AC signals decoupling function for the circuit unit 110. The decoupling unit 120 includes a mother die 120a, at least one stack-type integrated-passive-device die 120b, a plurality of third metal contacts 120c, and a plurality of fourth metal contacts 120d.

The third metal contacts 120c, which can be C4 (controlled-collapse-chip-connection) bumps, are formed on the mother die 120a and soldered onto the die 112, and each of the at least one stack-type integrated-passive-device die 120b has the fourth metal contacts 120d, which can be C2 (Cu-pillar-with-solder-cap) bumps, formed thereon and soldered onto the mother die 120a.

In a preferred embodiment, the at least one stack-type integrated-passive-device die 120b includes at least one decoupling capacitor, which is preferred to be stack-type capacitor to provide a high capacitance density. In addition, the stack-type capacitor can have multiple MIM (metal-insulator-metal) sandwich layers stacked in a small volume to provide sufficient capacitance for the AC signals decoupling function.

Accordingly, the circuit system of FIG. 3 can have a compact decoupling structure to provide a low profile form factor. In addition, due to the high capacitance density of the stack-type capacitor and close proximity of the decoupling unit 120 to the die 112, the compact decoupling structure can provide low parasite resistance and low parasite inductance to optimize the AC signals decoupling function.

Figure 4:
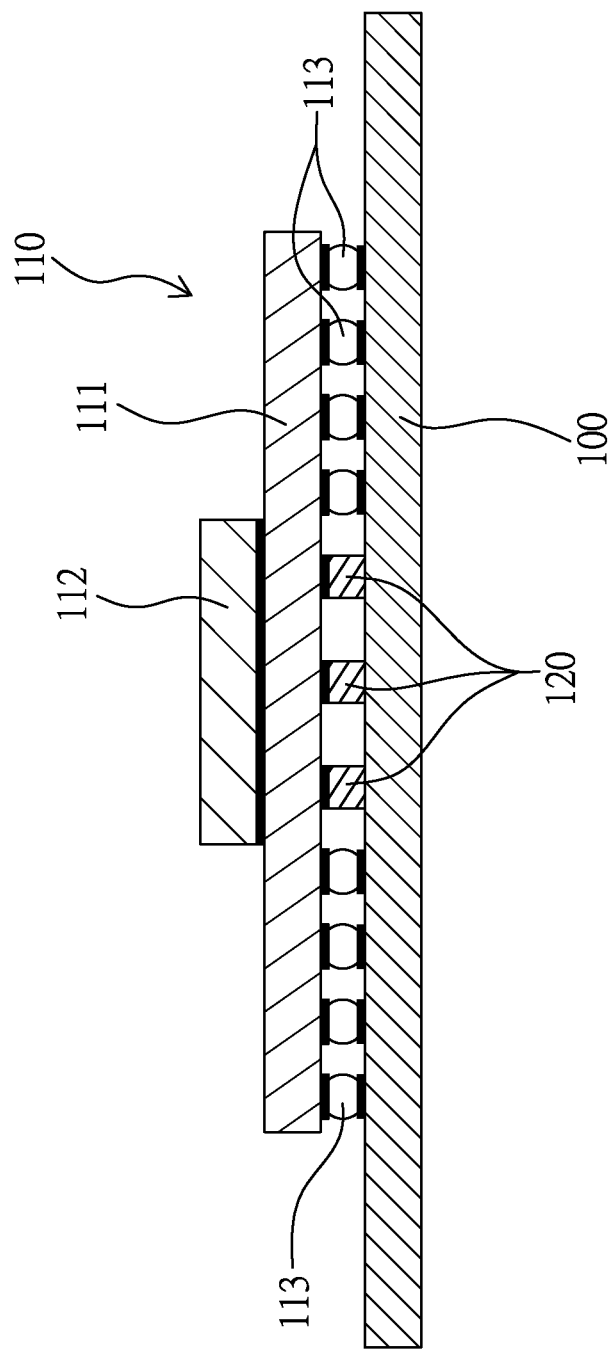
FIG. 4 illustrates a cross-sectional view of a circuit system having compact decoupling structure according to another embodiment of the present invention.

Please refer to FIG. 4, which illustrates a cross-sectional view of a circuit system having compact decoupling structure according to another embodiment of the present invention. As illustrated in FIG. 4, the circuit system having compact decoupling structure includes a mother board 100, at least one circuit unit 110, and at least one decoupling unit 120.

The mother board 100 is used for carrying the at least one circuit unit 110 and the at least one decoupling unit 120.

Each circuit unit 110 has a substrate 111, at least one die 112, and a plurality of metal contacts 113, the substrate 111 having a first surface 111a and a second surface 111b opposing the first surface 111a, the at least one die 112 being formed on the first surface 111a, the metal contacts 113 being formed on the second surface 111b and soldered onto the mother board 100. A gap is formed between the substrate 111 and the mother board 100 and has a height less than 50 micrometers. In a possible embodiment, the metal contacts are BGA (ball grid array) contacts.

The at least one decoupling unit 120 is placed in the gap and soldered onto the substrate 111 for providing an AC signals decoupling function for the at least one circuit unit 110.

In a preferred embodiment, the decoupling unit 120 includes a discrete capacitor having a height less than 30 micrometers, and the discrete capacitor is preferred to be a stack-type capacitor to provide a high capacitance density. The stack-type capacitor can have multiple MIM (metal-insulator-metal) sandwich layers stacked in a small volume to provide sufficient capacitance for the AC signals decoupling function.

Accordingly, the circuit system of FIG. 4 can have a compact decoupling structure to provide a low profile form factor. In addition, due to the high capacitance density of the stack-type capacitor and close proximity of the decoupling unit 120 to the circuit unit 110, the compact decoupling structure can provide low parasite resistance and low parasite inductance to optimize the AC signals decoupling function.

Figure 5:
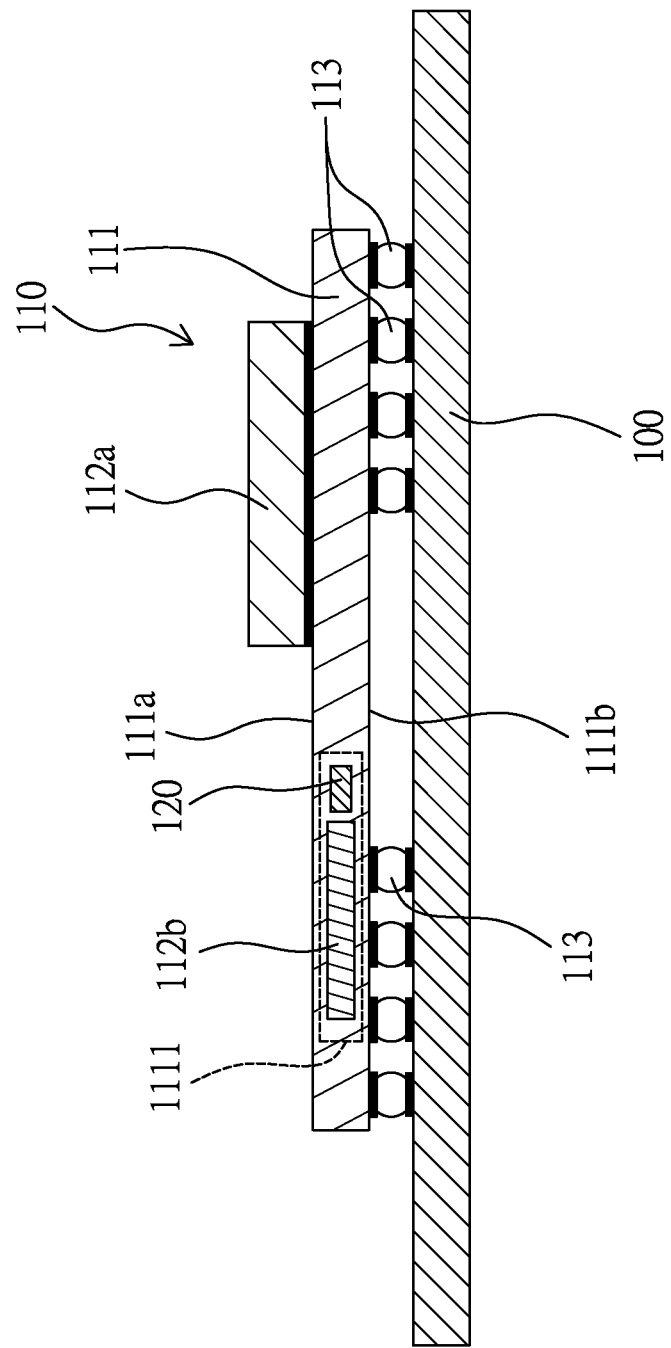
FIG. 5 illustrates a cross-sectional view of a circuit system having compact decoupling structure according to still another embodiment of the present invention.

Please refer to FIG. 5, which illustrates a cross-sectional view of a circuit system having compact decoupling structure according to still another embodiment of the present invention. As illustrated in FIG. 5, the circuit system having compact decoupling structure includes a mother board 100, at least one circuit unit 110, and at least one decoupling unit 120.

The mother board 100 is used for carrying the at least one circuit unit 110 and the at least one decoupling unit 120.

Each circuit unit 110 has a substrate 111, at least one first die 112a, at least one second die 112b, and a plurality of metal contacts 113, the substrate 111 having a first surface 111a and a second surface 111b opposing the first surface 111a.

The at least one first die 112a is formed on the first surface 111a, and the at least one second die 112b is embedded in an inner region 1111 of the substrate 111, the inner region 1111 having a height less than 50 micrometers.

The metal contacts 113 are formed on the second surface 111b and soldered onto the mother board 100, and a gap is formed between the substrate 111 and the mother board 100 and has a height less than 50 micrometers. In a possible embodiment, the metal contacts 113 are BGA (ball grid array) contacts.

The at least one decoupling unit 120 is placed in the inner region 1111 and connected electrically with the at least one second die 112b in close proximity, or placed in the gap and soldered onto the substrate 111 for providing an AC signals decoupling function for the at least one circuit unit 110.

In a preferred embodiment, the decoupling unit 120 includes a discrete capacitor having a height less than 30 micrometers, and the discrete capacitor is preferred to be a stack-type capacitor to provide a high capacitance density. The stack-type capacitor can have multiple MIM (metal-insulator-metal) sandwich layers stacked in a small volume to provide sufficient capacitance for the AC signals decoupling function.

Accordingly, the circuit system of FIG. 5 can have a compact decoupling structure to provide a low profile form factor. In addition, due to the high capacitance density of the stack-type capacitor and close proximity of the decoupling unit 120 to the circuit unit 110, the compact decoupling structure can provide low parasite resistance and low parasite inductance to optimize the AC signals decoupling function.

Thanks to the designs mentioned above, the present invention can therefore provide the advantages as follows:

1. The circuit system having compact decoupling structure of the present invention can provide a low profile form factor.

2. The circuit system having compact decoupling structure of the present invention can provide low parasite resistance and low parasite inductance to optimize the AC signals decoupling function.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A circuit system having compact decoupling structure, comprising:
   a mother board;
   a substrate;
   the substrate comprising a first surface and a second surface opposing the first surface;
   a plurality of first metal contacts;
   the plurality of first metal contacts being formed on the first surface of the substrate;
   the plurality of first metal contacts being soldered onto a surface of the mother board:
   a logic-circuit die;
   a surface of the logic-circuit die facing the second surface of the substrate;
   a plurality of second metal contacts;
   the plurality of second metal contacts being formed on the surface of the logic-circuit die;
   the plurality of second metal contacts being soldered onto the second surface of the substrate;
   the plurality of second metal contacts forming a plurality of flip-chip pillars;
   the flip-chip pillars determining a height of a gap between the logic-circuit die and the substrate;
   a mother die;
   a surface of the mother die facing the surface of the logic-circuit die;
   a plurality of third metal contacts;
   the plurality of third metal contacts being formed on the surface of the mother die;
   the plurality of third metal contacts being soldered onto the surface of the logic-circuit die;
   at least one decoupling capacitor;
   the at least one decoupling capacitor being formed in a gap between the mother die and the logic-circuit die;
   the at least one decoupling capacitor being configured for providing a capacitance density to perform an AC signals decoupling function for the logic-circuit die;
   a plurality of fourth metal contacts;
   the plurality of fourth metal contacts being formed on a surface of the at least one decoupling capacitor;
   the plurality of fourth metal contacts being soldered onto the surface of the mother die;
   the surface of the at least one decoupling capacitor facing the surface of the mother die; and
   the gap between the mother die and the logic-circuit die being smaller than the gap between the logic-circuit die and the substrate.

2. The circuit system having compact decoupling structure as disclosed in claim 1, wherein the second metal contacts are controlled-collapse-chip-connection bumps.

3. The circuit system having compact decoupling structure as disclosed in claim 1, wherein the third metal contacts are controlled-collapse-chip-connection bumps.

4. The circuit system having compact decoupling structure as disclosed in claim 1, wherein the fourth metal contacts are Cu-pillar-with-solder-cap bumps.

5. The circuit system having compact decoupling structure as disclosed in claim 1, wherein the decoupling capacitor is a stack-type capacitor having multiple MIM (metal-insulator-metal) sandwich layers.

6. The circuit system having compact decoupling structure as disclosed in claim 1, wherein the first metal contacts are BGA contacts.

* * * * *